US010129995B2

(12) United States Patent
Kwon

(10) Patent No.: US 10,129,995 B2
(45) Date of Patent: Nov. 13, 2018

(54) CASE FOR DISPLAY APPARATUS AND DISPLAY APPARATUS INCLUDING THE SAME

(71) Applicant: LG DISPLAY CO., LTD., Seoul (KR)

(72) Inventor: Changho Kwon, Bucheon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/661,805

(22) Filed: Jul. 27, 2017

(65) Prior Publication Data

US 2018/0035560 A1 Feb. 1, 2018

(30) Foreign Application Priority Data

Jul. 29, 2016 (KR) ........................ 10-2016-0097486

(51) Int. Cl.

*G06F 1/16* (2006.01)
*H05K 7/14* (2006.01)
*H05K 5/00* (2006.01)
*G02F 1/1333* (2006.01)
*H04N 5/64* (2006.01)

(52) U.S. Cl.

CPC ......... *H05K 7/14* (2013.01); *G02F 1/133308* (2013.01); *G06F 1/16* (2013.01); *H05K 5/0017* (2013.01); *G02F 2001/13332* (2013.01); *G02F 2001/133317* (2013.01); *G02F 2001/133322* (2013.01); *H04N 5/64* (2013.01)

(58) Field of Classification Search

CPC ...................................................... G06F 1/1601
See application file for complete search history.

(56) References Cited

U.S. PATENT DOCUMENTS

| | | | | |
|---|---|---|---|---|
| 8,098,487 | B2 * | 1/2012 | Choi | H04N 5/64 361/679.21 |
| 8,579,493 | B2 * | 11/2013 | Kawabata | G02F 1/133308 348/794 |
| 9,116,375 | B2 * | 8/2015 | Wang | G02F 1/133308 |
| 9,307,667 | B2 * | 4/2016 | Hirasawa | H05K 7/14 |
| 2008/0143918 | A1 * | 6/2008 | Kim | G02F 1/133608 349/58 |

* cited by examiner

*Primary Examiner* — Anthony Q Edwards
(74) *Attorney, Agent, or Firm* — Birch, Stewart, Kolasch & Birch, LLP

(57) ABSTRACT

A case for a display apparatus and the display apparatus including the same are discussed, which are beneficial in terms of publication of components and diversification of design. The case includes a guide protrusion at a corner portion of the guide panel, and the case top includes a guide groove in which the guide protrusion is located. If a guide panel body portion and a guide panel corner portion are separated from each other and are coupled to each other in an interference fit manner, such that the guide panel body portion is commonly used for public purposes and constituent components of the guide panel corner portion are changed, the case for the display apparatus properly copes with various display devices having different configurations.

9 Claims, 11 Drawing Sheets

CASE FOR DISPLAY APPARATUS AND DISPLAY APPARATUS INCLUDING THE SAME

CROSS-REFERENCE TO RELATED APPLICATION

This application claims the priority benefit of Korean Patent Application No. 10-2016-0097486, filed on Jul. 29, 2016 in the Korean Intellectual Property Office, the disclosure of which is incorporated herein by reference.

BACKGROUND OF THE INVENTION

1. Field of the Invention

The present disclosure relates to a case for a display apparatus and a display apparatus including the same, and more particularly to a case for a display apparatus that is beneficial in terms of publication of components and diversification of design, and a display apparatus including the same.

2. Description of the Related Art

Development of an information-oriented society is gradually increasing a demand for display devices in various forms. Accordingly, various flat panel display devices, such as Liquid Crystal Display (LCD), Plasma Display Panel (PDP), Electro Luminescent Display (ELD), Vacuum Fluorescent Display (VFD) devices, and the like, have recently been developed and rapidly come into widespread use.

Recently, with the increasing development of a fabrication process of such display panels, display panels and display devices including the same have been rapidly developed to implement products having thinner thickness and lighter weight. The display panels and the display devices including the same have also been rapidly developed in consideration of technical aspects and design aspects.

FIG. 1 is a structural view illustrating a general display apparatus.

Referring to FIG. 1, the display apparatus may include a display panel (DP) to display images thereon, a backlight unit (BLU) to provide a surface light source to the display panel (DP), and a case for the display apparatus wherein the display panel (DP) and the backlight unit (BLU) are integrated into the case.

The case for the display apparatus may include a guide panel (GP) to serve as a frame, a case top (CT) coupled to a front surface of the guide panel (GP) such that the display panel (DP) is fixed in a space between the guide panel (GP) and the case top (CT), and a cover bottom (CB) coupled to a back surface of the guide panel (GP) such that the backlight unit (BLU) is fixed in a space between the guide panel (GP) and the cover bottom (CB).

For convenience of description, a surface on which images of the display panel are displayed will hereinafter be referred to as a front surface, an opposite surface to the front surface will hereinafter be referred to as a back surface, and the remaining four side surfaces by which the front surface and the back surface are connected will hereinafter be referred to as lateral surfaces. In addition, the four lateral surfaces may be classified into an upper lateral surface, a lower lateral surface, a left lateral surface, and a right lateral surface on the basis of the position of images displayed on the display panel.

According to a coupling structure of the case of the display apparatus, the case top (CT), the guide panel (GP), and the cover bottom (CB) are integrated with one another using a coupling screw (S) from the viewpoint of a lateral surface.

According to the external appearance of the case for the assembled display apparatus, the case top (CT) may be exposed to the front surface of the case, the cover bottom (CB) and the guide panel (GP) may be exposed to the back surface of the case, and the guide panel (GP) and the cover bottom (CB) may be exposed to the lateral surfaces of the case.

When the display panel (DP) and the backlight unit (BLU) are integrated and assembled with the case for the display apparatus, the assembled structure will hereinafter be referred to as a display module.

The display module may be coupled to a screw (S) at a lateral surface thereof, and the guide panel (GP) and the cover bottom (CB) may be simultaneously exposed to the back surface of the display module, such that the visual appearance of the display module is deteriorated.

Therefore, when the display module is assembled with a display apparatus such as a television (TV) set or monitor, a back cover (BC) is coupled to a back surface of the display module.

The back cover (BC) may be formed in an approximately hexahedral shape, a front surface of which is opened, and may form the external appearance of a back surface and lateral surfaces of the display apparatus.

Although the back cover (BC) according to the embodiment shown in the drawings is configured to completely enclose lateral surfaces of the display apparatus, it should be noted that the back cover (BC) may partially enclose the lateral surfaces of the display apparatus and the case top (CT) may also be exposed to the remaining parts other than the enclosed surfaces according to product design.

With increasing development of lighter-weight and thinner display apparatuses, the case top (CT) and the cover bottom (CB) for constructing the case of the display apparatus have been manufactured from a press-molded metal sheet.

Since the guide panel (GP) has a complex shape, it is preferable that the guide panel (GP) be injection-molded using synthetic resins.

SUMMARY OF THE INVENTION

Accordingly, the present disclosure is directed to a case for a display apparatus and the display apparatus including the same that substantially obviate one or more problems due to limitations and disadvantages of the related art.

It is an object of the present disclosure to provide a technology for improving assembly quality of a guide panel (GP) and a case top (CT) for use in a case of a display apparatus including the guide panel (GP) and the case top (CT).

It is another object of the present disclosure to provide a technology for easily recognizing the assembly state of the case of the display apparatus including the guide panel (GP), the case top (CT), and the cover bottom (CB).

It is another object of the present disclosure to provide a case for a display apparatus that is beneficial in terms of publication of components and diversification of design. Since the case of the display apparatus is beneficial in terms of publication of components, the guide panel (GP) can be applied to public uses even when the external design of the case of the display apparatus is changed Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

In accordance with one aspect of the present disclosure, a case for a display apparatus includes a guide protrusion at a corner portion of a guide panel, and allows a case top to include a guide groove in which the guide protrusion is located, such that the case top can be more correctly coupled to the guide panel.

In this case, the guide panel includes a guide panel body portion and a guide panel corner portion having the guide protrusion. The guide panel body portion and the guide panel corner portion are separated from each other and are coupled to each other in an interference fit manner, such that the guide panel body portion is commonly used for public purposes and constituent components of the guide panel corner portion are changed, such that the guide panel can properly cope with various display devices having different designs.

In the interference fit structure, the guide panel body portion may include a coupling groove, and the guide panel corner portion may include a coupling protrusion. In this case, the edge wing of the guide panel corner portion and the support surface of the guide panel body portion may be fitted to each other through a separate engaging protrusion and a separate engaging groove.

In addition, the case for the display apparatus according to the present disclosure may further include a back cover to enclose a back surface and a lateral surface of the display apparatus, and may allow the back cover to be supported by a back surface of the guide protrusion.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE EMBODIMENTS

Figure 1:
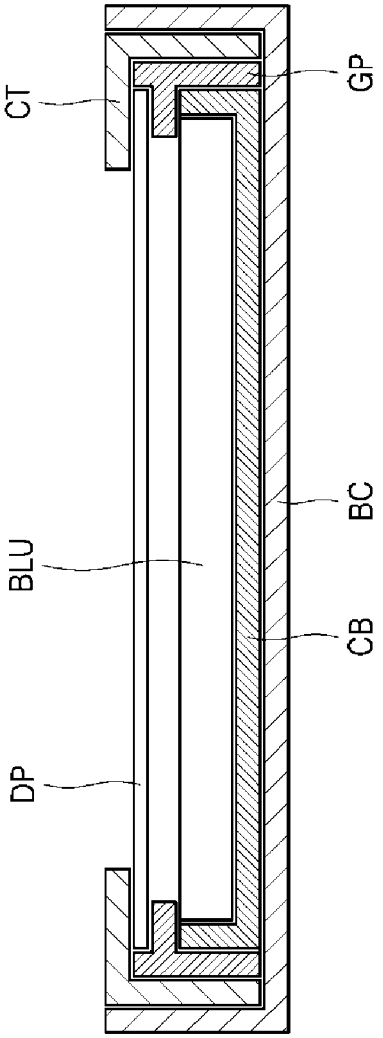
FIG. 1 is a structural view illustrating a general display apparatus.

Reference will now be made in detail to the embodiments of the present disclosure, examples of which are illustrated in the accompanying drawings, wherein like reference numerals refer to like elements throughout. A case for a display apparatus and the display apparatus including the same according to embodiments of the present disclosure will hereinafter be described with reference to the attached drawings.

In addition, the display panel according to the present disclosure may be any one of various display panels, for example, a Liquid Crystal Display (LCD), a Plasma Display Panel (PDP), an Electro Luminescent Display (ELD), a Vacuum Fluorescent Display (VFD), an Organic Light Emitting Display (OLED) panels, etc.

Figure 2:
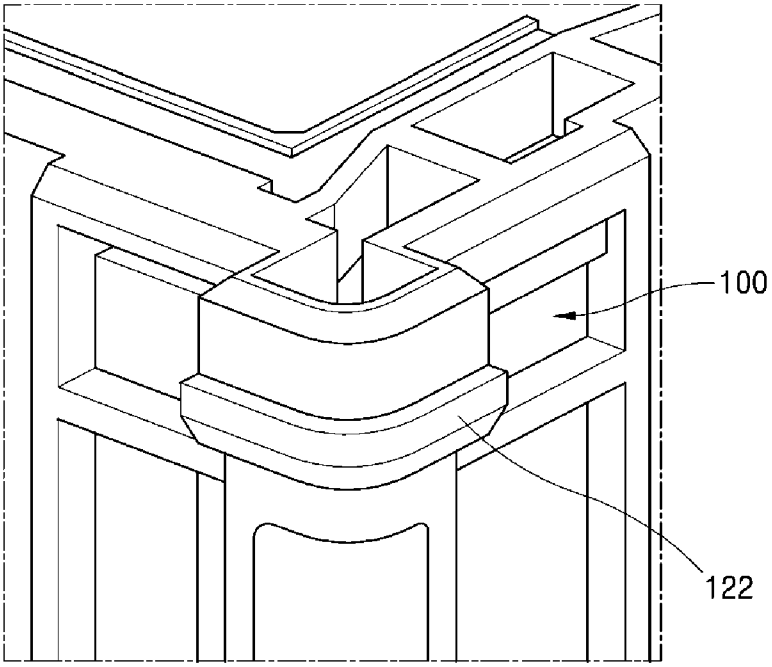
FIG. 2 is a perspective view illustrating a guide panel (GP) corner portion of a case for a display apparatus according to a first embodiment of the present disclosure.
Figure 3:
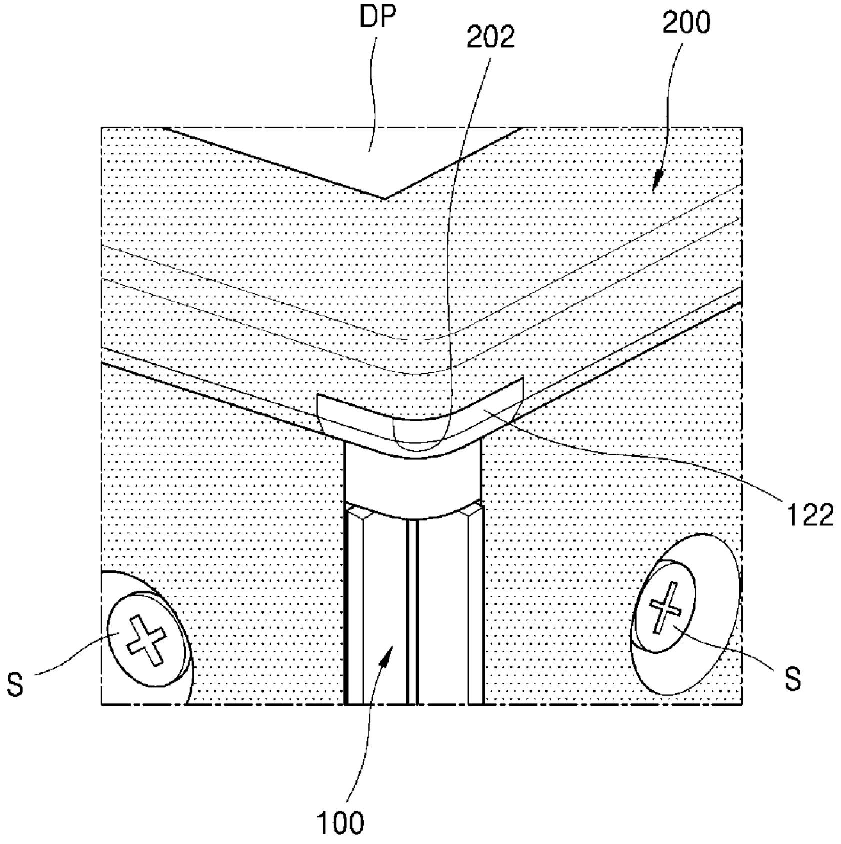
FIG. 3 is a perspective view illustrating a coupling state among a guide panel (GP), a case top (CT), and a cover bottom (CB) of the case for the display apparatus according to the first embodiment of the present disclosure.

FIG. 2 is a perspective view illustrating a guide panel (GP) corner portion of a case for a display apparatus according to a first embodiment of the present disclosure. FIG. 3 is a perspective view illustrating a coupling state among a guide panel (GP), a case top (CT), and a cover bottom (CB) of the case for the display apparatus according to the first embodiment of the present disclosure. All the components of the display apparatus according to all embodiments of the present disclosure are operatively coupled and configured.

Referring to FIG. 2, the case for the display apparatus according to the present disclosure may include a guide panel 100 and a case top 200.

In order to clearly differentiate the case top 200 from the guide panel 100 in FIG. 2, shaded colors having different densities are given to the case top 200, such that the case top is displayed with such shaded colors having different densities.

The guide panel 100 may include a guide protrusion 122 protruding outward at a corner portion at which lateral sides meet.

The guide panel 100 is formed of synthetic resin through injection-molding, and the guide protrusions 122 may be incorporated with the guide panel 100.

FIG. 2 is an enlarged view illustrating only the corner portion of the guide panel 100. The guide protrusions 122 having the same shape may be respectively formed at the four corners of the guide panel 100.

The guide protrusions 122 may fasten coupling between the case top 200 and the guide panel 100 such that the case top 200 and the guide panel 200 can be correctly coupled to each other through the guide protrusions 122.

The case top 200 may include guide grooves 202, each of which is formed to enclose each guide protrusion 122 when coupled to the guide panel 100.

The guide groove 202 shown in FIG. 2 may be provided to each corner of the case top 200. The case top 200, which is formed like a picture frame may be implemented as a single component. Alternatively, the respective sides of the case top 200 may be separated from one another such that the respective sides can be implemented as four components. The upper lateral surface and both lateral surfaces of the case top 200 may be implemented as a single 'ㄷ'-shaped component, and a lower lateral surface of the case top 200 may be implemented as a single '—'-shaped component.

Although the case top 200 is implemented as a single component or a plurality of divided components, the case top 200 may be formed to have a '⊔'-shaped frame shape when assembled with the guide panel 100. In the above-mentioned coupling state, the guide groove 202 may be implemented at each corner of the case top 200.

Referring to FIG. 3, when the case top 200 is coupled to the guide panel 100, it may be preferable that the surface of the case top 200 be smoothly connected to the surface of the guide protrusion 122 of the guide panel 100.

The above-mentioned connection may be implemented by allowing a protrusion height of the guide protrusion 122 to correspond to a thickness of the case top 200.

If the guide protrusion 122 is provided at each corner of the guide panel 100 and the guide groove 202 of the case top 200 encloses the above guide protrusion 122, the guide panel 100 can be more accurately coupled to each corner of the case top 200.

In the case of using the above-mentioned structure, a user can easily view and recognize a coupling state between the guide protrusion 122 and the guide groove 202 with the naked eye, such that the user can also confirm whether the case top 200 is correctly coupled to the guide panel 100 by referring to the coupling state between the guide protrusion 122 and the guide groove 202.

Figure 4:
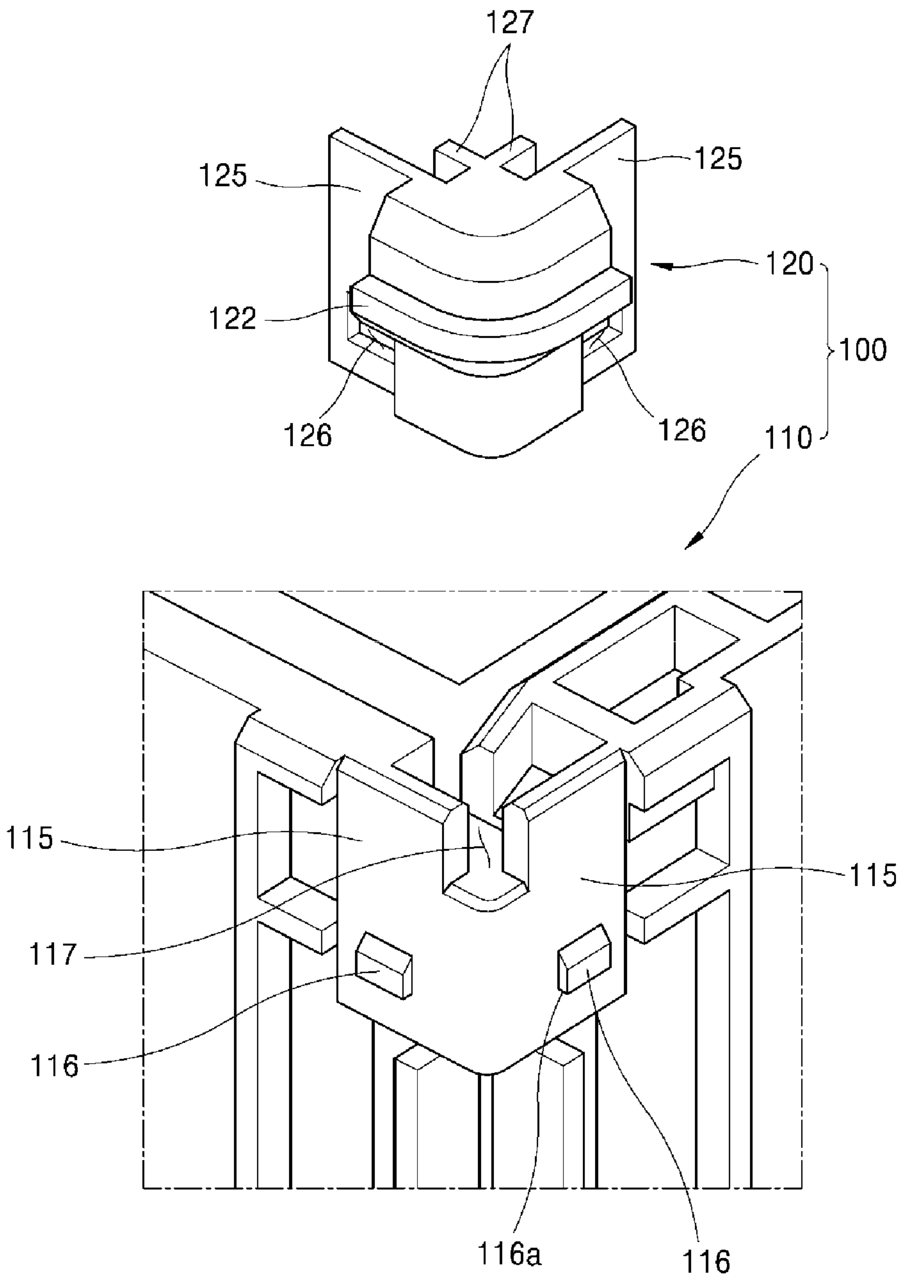
FIG. 4 is an exploded perspective view illustrating a guide panel of a case for a display apparatus according to a second embodiment of the present disclosure.
Figure 5:
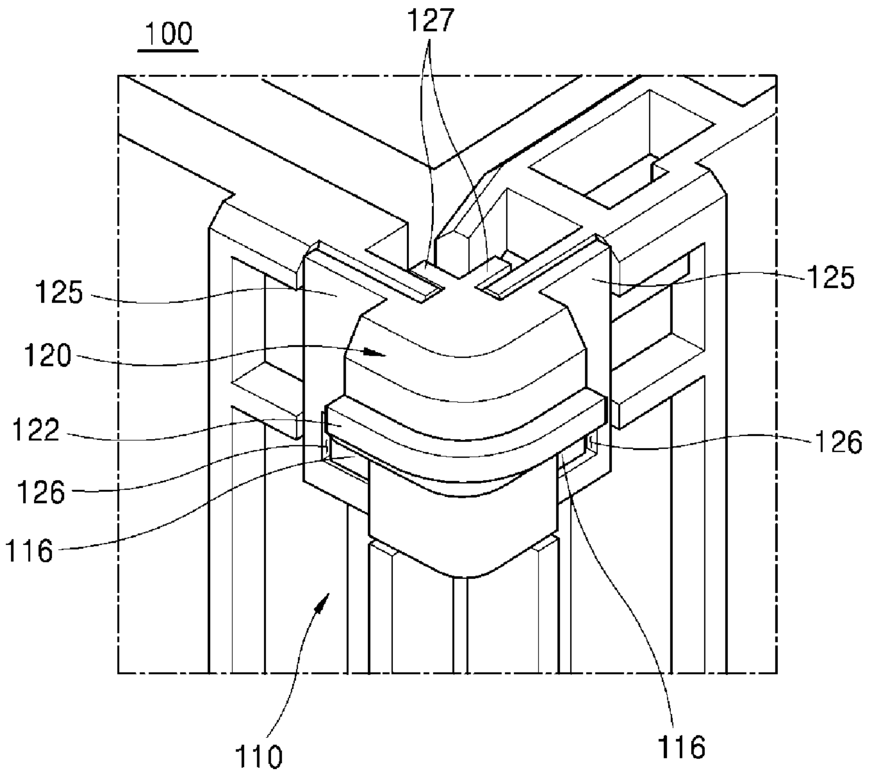
FIG. 5 is a view illustrating a coupling state of the guide panel of the case for the display apparatus according to the second embodiment of the present disclosure.

FIG. 4 is an exploded perspective view illustrating a guide panel of a case for a display apparatus according to a second embodiment of the present disclosure. FIG. 5 is a view illustrating a coupling state of the guide panel of the case for the display apparatus according to the second embodiment of the present disclosure.

Referring to FIG. 4, the guide panel 100 of the case for the display apparatus according to the second embodiment of the present disclosure is characterized in that arrangement parts of the guide protrusions 122 are formed as separate or independent components at the corners of the guide panel.

The guide panel 100 according to the embodiment may include a guide panel body portion 110 and a guide panel corner portion 120 coupled to respective corners of the guide panel body portion 110.

In other words, the guide panel 100 may be constructed by coupling four guide panel corner portions 120 to one guide panel body portion 110.

Each corner of the guide panel corner portion 120 may include a guide protrusion 122, and the guide panel corner portion 120 may include an edge wing 125 facing the guide panel body portion 110.

The edge wing 125 may be formed to enclose the outer surface of the corner portion of the guide panel body portion 110.

The guide panel body portion 110 may include a support surface 115 facing the edge wing 125 of the guide panel corner portion 120 such that the edge wing 125 can be supported by the support surface 115.

If the guide panel corner portion 120 is coupled to the guide panel body portion 110, the edge wing 125 may surface-contact the support surface 115.

The guide panel corner portion 120 may be fixed to the guide panel body portion 110 in an interference fit manner.

The guide panel body portion 110 may include a coupling groove 117 incised from a front surface to a back surface at a corner portion thereof. The guide panel corner portion 120 may include a coupling protrusion 127 inserted into the coupling groove 117.

The guide panel corner portion 120 may be coupled to the guide panel body portion 110 in an interference fit manner such that the guide panel corner portion 120 is fitted into the guide panel body portion 110 while sliding in the direction from the front surface to the back surface of the guide panel body portion 110. In this case, the coupling protrusion 127 may be inserted into the coupling groove 117.

If the coupling protrusion 127 of the guide panel corner portion 120 is inserted into the coupling groove 117 of the guide panel body portion 110, the guide panel corner portion 120 is fastened and locked to the guide panel body portion 110, such that the guide panel corner portion 120 cannot move in vertical and horizontal directions with respect to the guide panel body portion 110.

In order to lock the guide panel corner portion 120 in a forward and backward direction with respect to the guide panel body portion 110, an engaging groove 126 may be provided to each edge wing 125 of the guide panel corner portion 120, and an engaging protrusion 116 may be provided to a support surface 115 of the guide panel body portion 110.

Preferably, the engaging protrusion 116 and the engaging groove 126 may be configured to lock the guide panel corner portion 120 such that the guide panel corner portion 120 is not released in a forward direction of the display apparatus.

According to the embodiment of the present disclosure, when the engaging groove 126 may be formed at the edge wing 125 of the guide panel corner portion 120 and the engaging protrusion 116 is formed at the support surface 115 of the guide panel body portion 110, a stopper projection **116*a* is formed at a lower part of the engaging protrusion 116, such that the edge wing 125 is locked to the support surface 115 in a manner that the edge wing 125 is not released in a forward direction of the support surface 115**.

The engaging protrusion and the engaging groove are locked to each other. Differently from the embodiment shown in the drawings, the edge wing 125 of the guide panel corner portion 120 may be provided with the engaging protrusion, and the support surface 15 of the guide panel body portion 110 may be provided with the engaging groove.

As described above, the guide panel corner portion 120 may be coupled to the guide panel body portion 110 in an interference fit manner. Since the engaging protrusion 127 is fitted into the engaging groove 117, vertical movement and horizontal movement of the guide panel corner portion 120 are locked. Since the engaging protrusion 116 and the engaging groove 125 are coupled to each other in an interference fit manner, forward and backward movement of the guide panel is locked.

Accordingly, the guide panel corner portion 120 may be completely locked to the guide panel body portion 110 in three-axial directions through interference fit.

The guide panel corner portion 120 including the guide protrusion 122 is formed as a separate component, and is then coupled to the guide panel body portion 110. In the case of using the above-mentioned coupling structure, the guide panel body portion 110 is commonly used when the shape of the guide protrusion 122 is changed, and at the same time only the components of the guide panel corner portion 120 can be replaced with others, such that the guide panel body portion 110 can properly cope with the changed shape of the guide protrusion 122.

The shape of the guide protrusion 122 may relate to the design of the case top and the back cover corresponding to other constituent components of the case of the display apparatus.

When the case for the display apparatus uses display panels having the same specifications and the outer design of the case is changed, the case top and the back cover should be changed in shape, such that the shape of the guide protrusion 122 may also be changed.

In this case, if a part including the guide protrusion 122 is divided as a separate component (i.e., the guide panel corner portion), such division can be properly handled by replacement of the guide panel corner portion 120 acting as the component having the guide protrusion 122, and the guide panel body portion 110, as a large-sized injection-molded product can be commonly used for various designs.

In addition, if the guide panel corner portion 120 is manufactured as a separate component, the color or material of the guide panel corner portion 120 can be changed in a different way from the guide panel body portion 110.

Generally, the guide panel may be formed of a black-colored synthetic resin. However, provided that the case top and the back cover of the display apparatus are colored white, if only the guide protrusion exposed outside is colored block, the quality of the entire appearance of the display apparatus may be deteriorated.

On the other hand, the guide panel relates to optical characteristics of the backlight unit, such that the guide panel may be formed of synthetic resin colored white. In this case, if the case top and the back cover are colored black, the guide protrusion exposed outside looks conspicuous, resulting in poor aesthetics.

In this case, only the component of the guide panel corner portion 120 is colored another color, such that a user may not feel sense of color difference between the guide panel corner portion 120 and the case top or back cover.

In addition, since the guide panel corner portion 120 may not provide structural strength, only the guide panel corner portion 120 may be formed of an elastic material such that frictional force may increase when the guide panel corner portion 120 is coupled to the case top.

Figure 6:
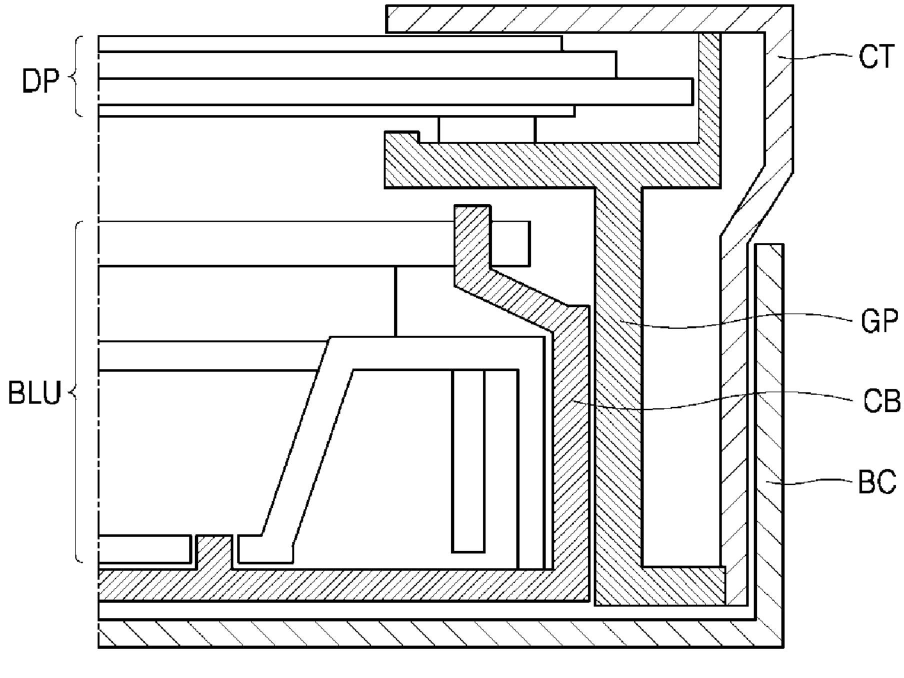
FIGS. 6 and 7 are cross-sectional views illustrating coupling states of two representative designs of the case for the display apparatus according to the embodiments of the present disclosure.
Figure 7:
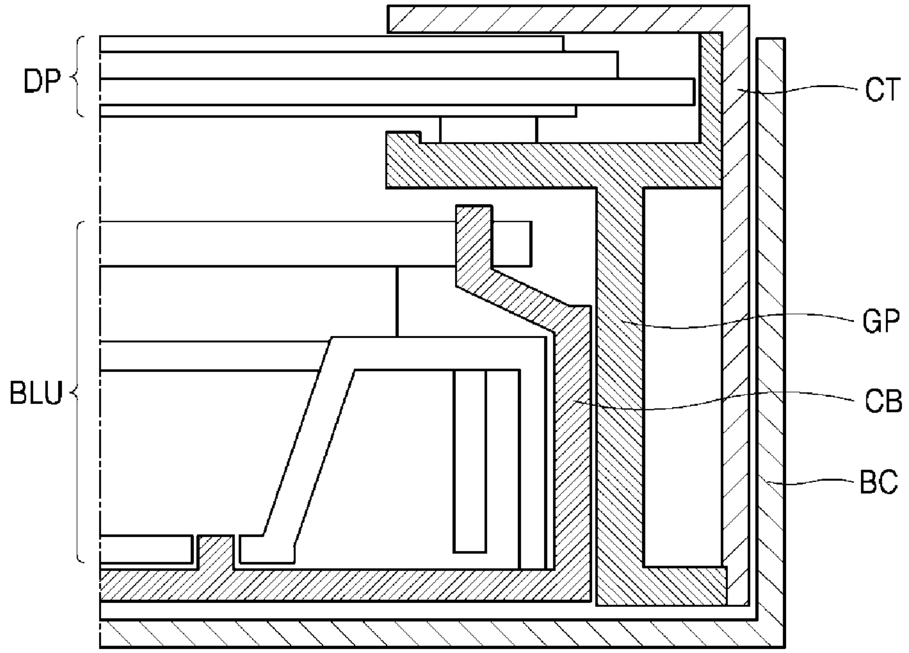

FIGS. 6 and 7 are cross-sectional views illustrating coupling states of two representative designs of the case for the display apparatus according to the embodiments of the present disclosure.

The display panel (DP) and the backlight unit (BLU) are modularized as a case for the display apparatus, resulting in formation of the display module. If the display apparatus such as a TV set or monitor is manufactured using the display module, the back cover 300 may be attached to the back surface of the display module.

The appearance of the display apparatus may be classified into two design types according to a coupling shape between the case top (CT) and the back cover (BC).

In accordance with a first design type, the front surface of the side part is formed in a manner that the case top (CT) is directly exposed, and the back surface is enclosed with the back cover (BC), as can be seen from FIG. 6.

In accordance with a second design type shown in FIG. 7, the entirety of the side part is enclosed with the back cover (BC).

The structure of the above-mentioned second embodiment can be applied to the design of the display apparatus shown in FIG. 6.

Figure 8:
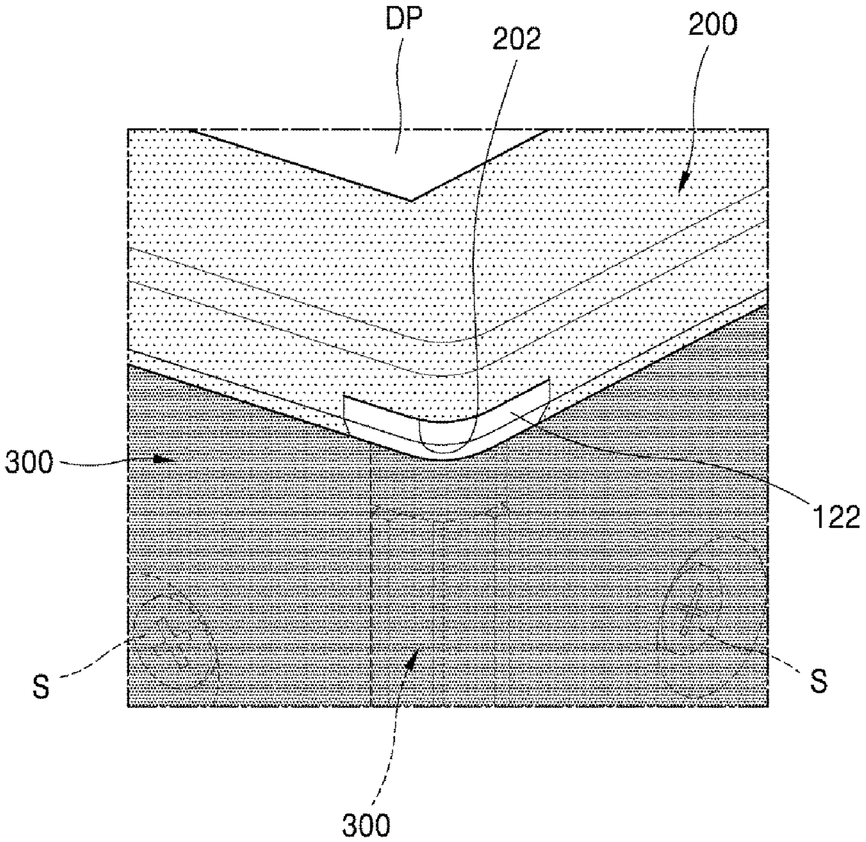
FIG. 8 is a view illustrating a display apparatus using the case for the display apparatus according to the second embodiment of the present disclosure.

FIG. 8 is a view illustrating a display apparatus using the case for the display apparatus according to the second embodiment of the present disclosure.

Referring to FIG. 8, the case top 200 and the back cover 300 may construct the lateral appearance of the display apparatus, and the guide protrusion 122 of the guide panel is exposed at the corner portion. The back cover 300 may be coupled to enclose some parts of the back surface and the lateral surface of the display apparatus.

In this case, a front end of the back cover 300 may be supported by a back end of the guide protrusion 122. This structure may allow the case top 200 to be assembled with the back cover 300 on the basis of the guide protrusion 122 of the guide panel.

In addition, the surface of the back cover 300 and the surface of the case top 200 are preferably placed in the same plane from the viewpoint of a lateral surface.

For this purpose, the case top (200) may be formed in a manner that its own lateral surface overlapping with the back cover 300 is recessed inward. In order to place the lateral surface of the back cover 300 in the same plane as the case top 200 during coupling of the back cover 300, the recess depth may correspond to a thickness of the back cover 300.

Figure 9:
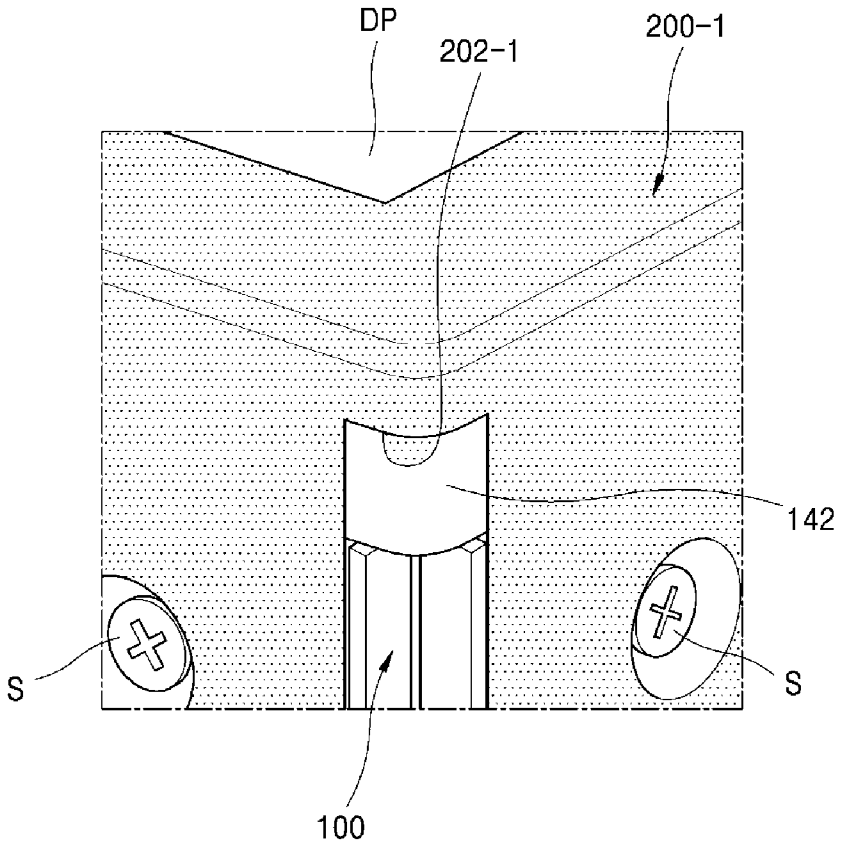
FIG. 9 is a view illustrating a coupling state between a guide panel (GP) and a case top (CT) of a case for a display apparatus according to a third embodiment of the present disclosure.

FIG. 9 is a view illustrating a coupling state between a guide panel (GP) and a case top (CT) of a case for a display apparatus according to a third embodiment of the present disclosure.

Referring to FIG. 9, the case for the display apparatus according to the present disclosure may be formed flat without causing an inward recessed portion of a lateral surface of the case top 200-1.

As previously stated in FIG. 7, the back cover (BC) is formed to enclose the entire lateral surface of the case top (CT) such that the lateral appearance of the display apparatus can be formed by the back cover.

As described above, the corner portion of the guide panel may be provided with the guide protrusion 142, and a guide groove 202-1 is formed to enclose the guide protrusion 142, and, as such, a detailed description thereof will herein be omitted for convenience of description.

Figure 10:
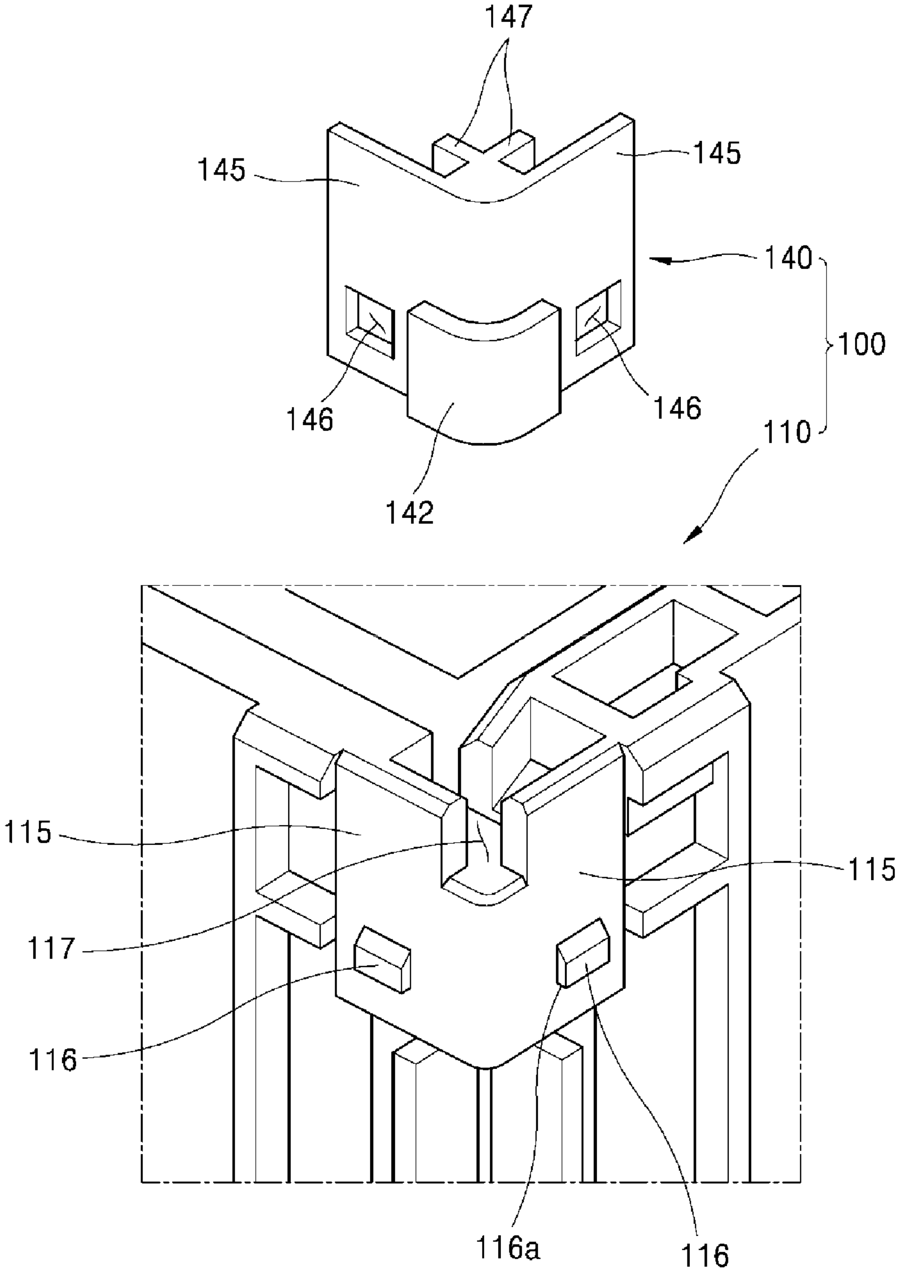
FIG. 10 is an exploded perspective view illustrating a guide panel of the case for the display apparatus according to the third embodiment of the present disclosure.
Figure 11:
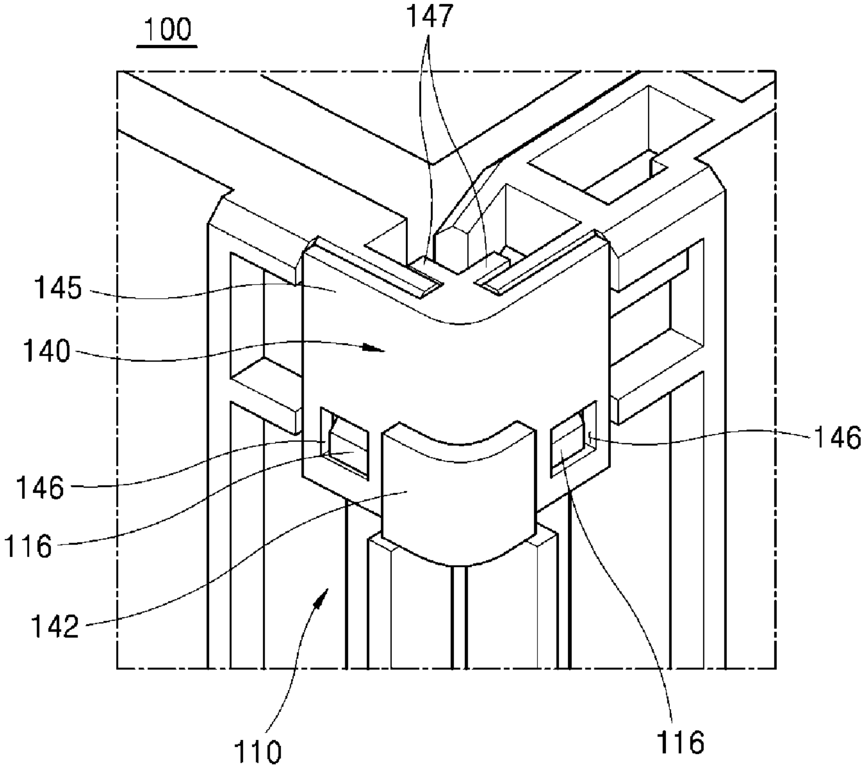
FIG. 11 is a view illustrating a coupling state of the guide panel of the case for the display apparatus according to the third embodiment of the present disclosure.

FIG. 10 is an exploded perspective view illustrating a guide panel of the case for the display apparatus according to the third embodiment of the present disclosure. FIG. 11 is a perspective view illustrating a coupling state of the guide panel of the case for the display apparatus according to the third embodiment of the present disclosure.

Referring to FIG. 10, the guide panel 100 is formed by interference fit between the guide panel body portion 110 and the guide panel corner portion 140.

The guide panel body portion 110 of FIG. 10 may be identical in structure with the guide panel body portion 110 illustrated in the above-mentioned second embodiment.

The guide panel corner portion 140 may include a coupling protrusion 147 inserted into the coupling groove 117 of the guide panel body portion 110, an edge wing 145 surface-contacting the support surface 115 of the guide panel body portion 110, and an engaging groove 146 formed at the edge wing 145.

However, the shape of the guide protrusion 142 and the height of the guide protrusion 142 may be different from those of the guide protrusion of the guide panel corner portion (see 120 of FIG. 4) of the second embodiment.

According to change in the shape of the display apparatus, the case top and the back cover may also be changed in shape. Accordingly, if there is a need to change the shape or the height of the guide protrusion of the guide panel, this change can be properly handled by replacement of only the guide panel corner portions 120 and 140, such that components of the guide panel body portion 110 can be commonly used for public purposes.

As is apparent from the above description, the case for the display apparatus according to the present disclosure includes a guide protrusion at each corner of the guide panel (GP), and allows the case top (CT) to have a seating groove in which the guide protrusion is seated, such that the case top (CT) can be more accurately coupled to the guide panel (GP).

In addition, according to the case for the display apparatus according to the present disclosure, the guide panel (GP) is divided into a guide panel (GP) body portion and a guide panel (GP) corner portion, such that the guide panel (GP) body portion and the guide panel (GP) corner portion are formed as separate components and the guide panel (GP) body portion and the guide panel (GP) corner portion are fitted to each other. As a result, the design of the guide panel (GP) corner portion can be modified in various ways according to various appearance designs/configurations of the display apparatus.

According to the above-mentioned structures, although the external design/configuration is changed when panels of the display apparatus have the same specification, the guide panel (GP) body portion is applicable to public use and only components of the guide panel (GP) corner portion can be modified in various ways without departing from the scope or spirit of the present disclosure, resulting in publication of components.

The present disclosure described above may be variously substituted, altered, and modified by those skilled in the art to which the present disclosure pertains without departing from the scope and sprit of the present disclosure. Therefore, the present disclosure is not limited to the above-mentioned exemplary embodiments and the accompanying drawings.

What is claimed is:

1. A case for a display apparatus, the case comprising:
- a guide panel located at a rear of a display panel, and configured to support the display panel; and
- a case top configured to enclose a front surface border and a lateral surface of the display panel,
- wherein the guide panel includes a guide protrusion at an outer surface,
- wherein the case top includes a guide groove in which the guide protrusion is located, the guide protrusion being provided at a corner portion of the guide panel, and
- wherein the guide panel includes:
  - a guide panel body portion including a coupling groove incised from a front surface to a back surface at a corner portion where lateral surfaces meet; and
  - a guide panel corner portion including the guide protrusion and a coupling protrusion, the coupling protrusion being inserted into the coupling groove to couple the guide panel corner portion to the guide panel body portion in an interference fit manner.

2. The case for the display apparatus according to claim 1, wherein the guide panel body has a picture frame shape.

3. The case for the display apparatus according to claim 2, wherein the guide panel body portion and the guide panel corner portion are formed of heterogeneous materials or heterogeneous colors.

4. The case for the display apparatus according to claim 2, further comprising:
- a back cover formed to enclose a lateral surface of the case top at a back surface of the case top.

5. The case for the display apparatus according to claim 4, wherein the case top is formed in a manner that a lateral surface thereof overlapping with the back cover is recessed inward.

6. The case for the display apparatus according to claim 5, wherein a front surface of the back cover is supported by a back surface of the guide protrusion.

7. A display apparatus comprising:
- a display panel;
- a backlight unit to provide the display panel with a surface light source; and
- the case according to claim 1 to integrate the display panel and the backlight unit into one module.

8. A case for a display apparatus, the case comprising:
- a guide panel located at a rear of a display panel, and configured to support the display panel; and
- a case top configured to enclose a front surface border and a lateral surface of the display panel,
- wherein the guide panel includes a guide protrusion at an outer surface, and the case top includes a guide groove in which the guide protrusion is located, the guide protrusion being provided at a corner portion of the guide panel,
- wherein the guide panel includes a guide panel body portion, and a guide panel corner portion including the guide protrusion,
- wherein the guide panel corner portion includes an edge wing,
- wherein the guide panel body portion includes a support surface supporting the edge wing, and
- wherein the edge wing includes one of an engaging protrusion and an engaging groove that are coupled to each other, and the support surface includes the other of the engaging protrusion and the engaging groove.

9. The case for the display apparatus according to claim 8, wherein the engaging protrusion includes a stopper projection for fixing the guide panel corner portion, such that the guide panel corner portion is not released in a forward direction of the guide panel body portion.

* * * * *